United States Patent
Chen et al.

(10) Patent No.: US 10,830,793 B2
(45) Date of Patent: Nov. 10, 2020

(54) DEFLECTING DEVICE FOR A PROBE

(71) Applicants: Kuan-Hung Chen, Taichung (TW);
Li-Cheng Richard Zai, Taipei (TW)

(72) Inventors: Kuan-Hung Chen, Taichung (TW);
Li-Cheng Richard Zai, Taipei (TW)

( * ) Notice: Subject to any disclaimer, the term of this patent is extended or adjusted under 35 U.S.C. 154(b) by 110 days.

(21) Appl. No.: 16/260,170

(22) Filed: Jan. 29, 2019

(65) Prior Publication Data
US 2020/0241041 A1 Jul. 30, 2020

(51) Int. Cl.
*G01R 1/067* (2006.01)
*G01R 31/28* (2006.01)

(52) U.S. Cl.
CPC ..... *G01R 1/06705* (2013.01); *G01R 1/06722* (2013.01); *G01R 1/06788* (2013.01); *G01R 31/2808* (2013.01)

(58) Field of Classification Search
CPC ............ G01R 1/06705; G01R 1/06722; G01R 1/06788; G01R 31/2808; G01R 1/07342; G01R 1/26; G01R 1/0466
USPC .............. 324/755.05, 754.03, 715, 724, 149, 324/757.01
See application file for complete search history.

(56) References Cited

U.S. PATENT DOCUMENTS

| | | | | | |
|---|---|---|---|---|---|
| 3,458,687 | A | * | 7/1969 | Cranch | G01R 1/06705 219/521 |
| 3,551,807 | A | * | 12/1970 | Burke | G01R 1/07342 324/72.5 |
| 4,056,777 | A | * | 11/1977 | Roch | G01R 1/067 324/750.22 |
| 4,068,168 | A | * | 1/1978 | Boonstra | G01N 27/041 324/722 |
| 4,272,892 | A | * | 6/1981 | Rose | G01B 5/0002 324/750.25 |
| 8,305,101 | B2 | * | 11/2012 | Desta | G01R 1/07378 324/755.01 |

FOREIGN PATENT DOCUMENTS

WO    WO-2010071275 A1 *  6/2010  ......... G01R 31/2891

* cited by examiner

*Primary Examiner* — Tung X Nguyen
*Assistant Examiner* — Robert P Alejnikov, Jr.
(74) *Attorney, Agent, or Firm* — Burris Law, PLLC (57) ABSTRACT

A deflecting device includes a base member, an axle member, a probe mounting seat, a swing arm assembly, and an actuating assembly. The axle member is disposed in the base member, and has a front end that extends out of the base member and that is mounted with the probe mounting seat. The swing arm assembly includes a swing arm disposed in the base member, and having an upper end that is formed with a guide slot, and a lower end that is connected to the axle member. The actuating assembly includes a screw member that is mounted to the base member, and a slider member that has an engaging portion slidably engaging the base member and formed with a threaded driven hole that screws with the screw member, and a tubular portion engaging the guide slot.

9 Claims, 14 Drawing Sheets

DEFLECTING DEVICE FOR A PROBE

FIELD

The disclosure relates to a deflecting device, more particularly to a deflecting device for a PCB test probe.

BACKGROUND

Figure 1:
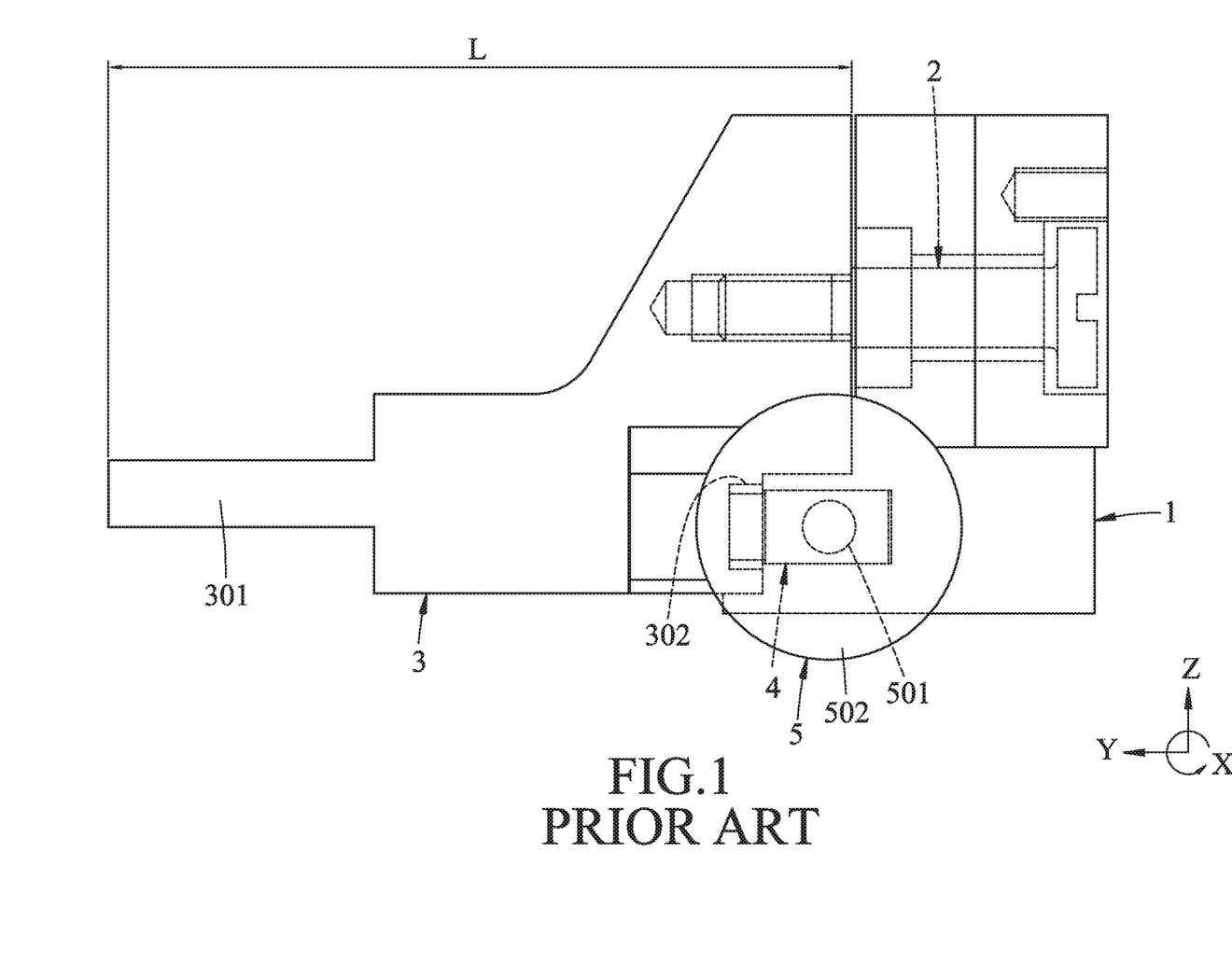
FIG. 1 is a schematic diagram of a right side of a conventional deflecting device for a probe.
Figure 2:
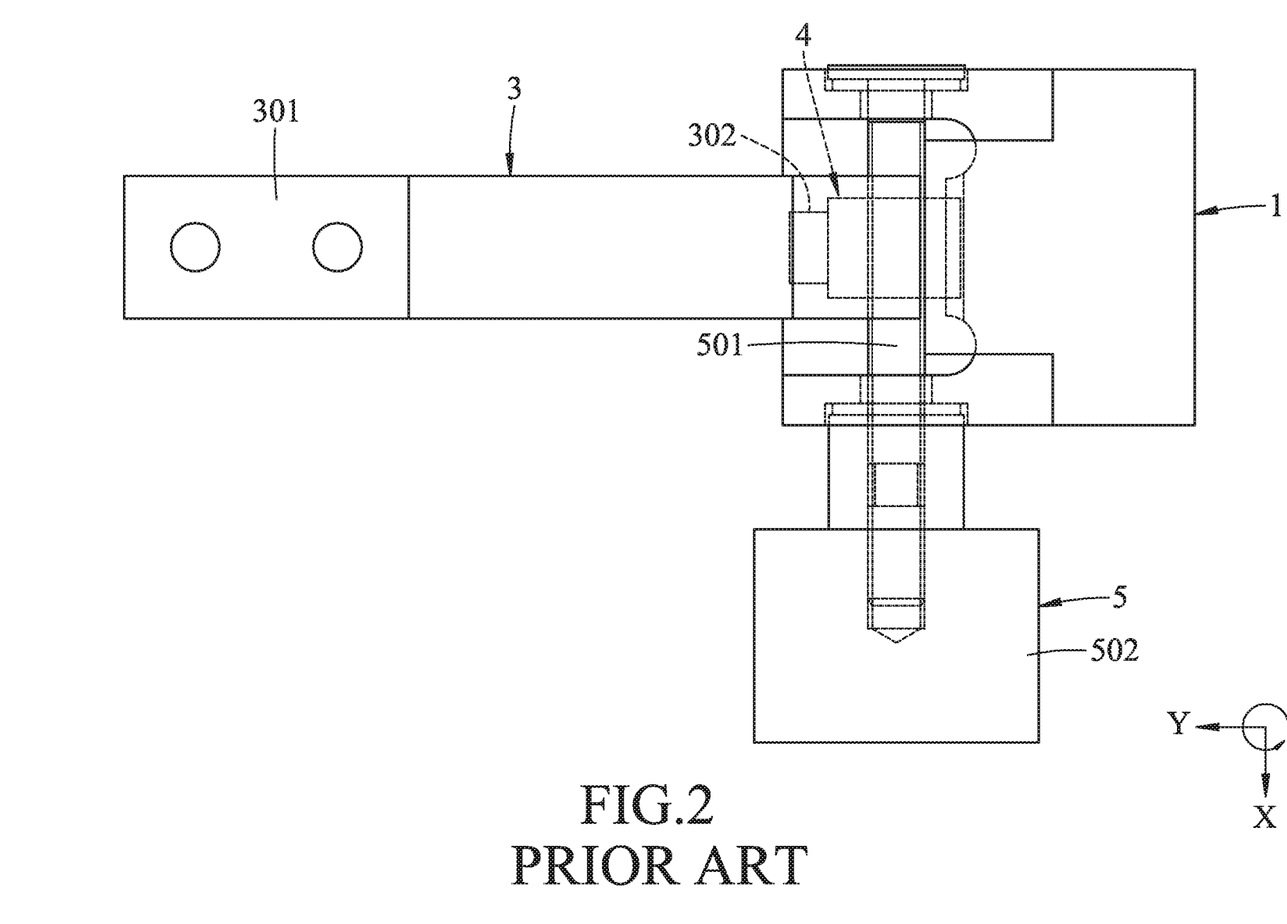
FIG. 2 is a top view of the conventional deflecting device.
Figure 3:
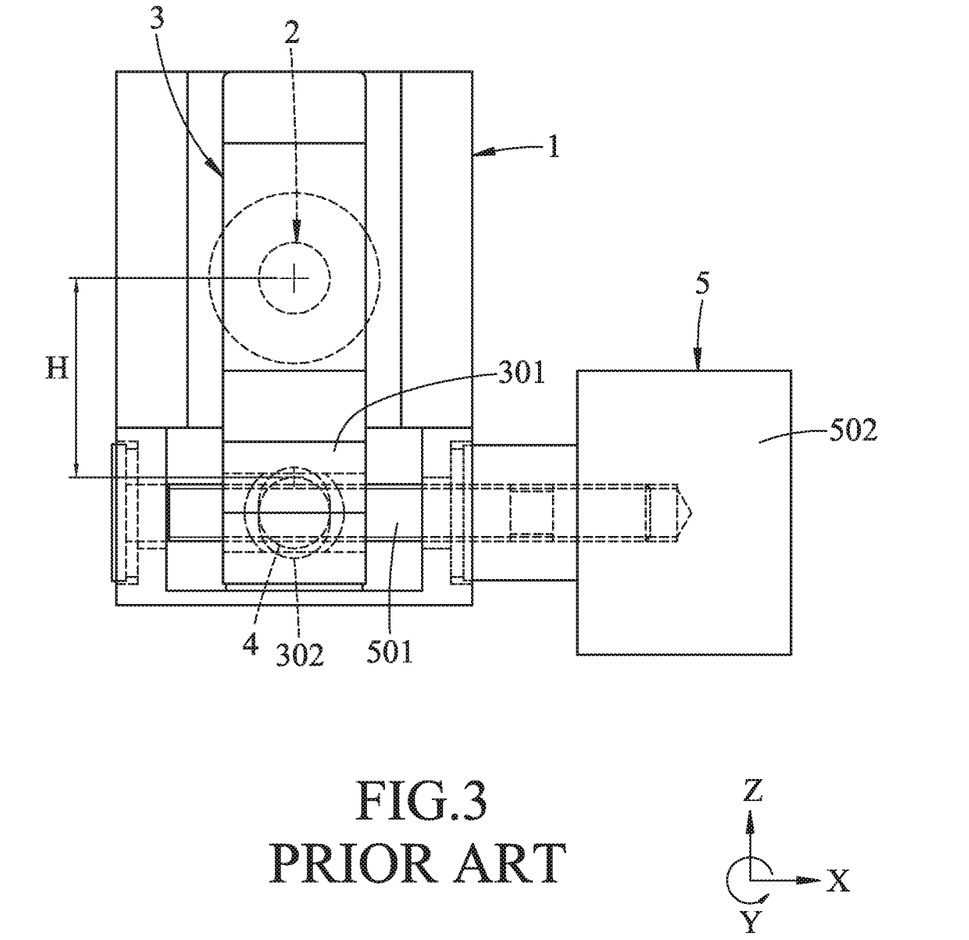
FIG. 3 is a front view of the conventional deflecting device.

As shown in FIGS. 1, 2, and 3, a conventional device for deflecting a probe includes a base seat 1, a shaft 2 mounted on the base seat 1 and extends in a front-rear direction (Y), a probe seat 3 turnably disposed to the shaft 2, a nut member 4 disposed on the base seat 1 and movable in a left-right direction (X), and an adjustment knob 5 mounted to the base seat 1 and screwed with the nut member 4. The probe seat 3 includes a mounting plate 301 at the front end for attaching a probe (not shown) and an oblong hole 302 at the rear end. The nut member 4 is engaged with the oblong hole 302. The adjustment knob 5 is connected to a threaded rod 501 that extends in the left-right direction (X) and that is screwed with the nut member 4, and has manual knob 502 at one end.

Figure 4:
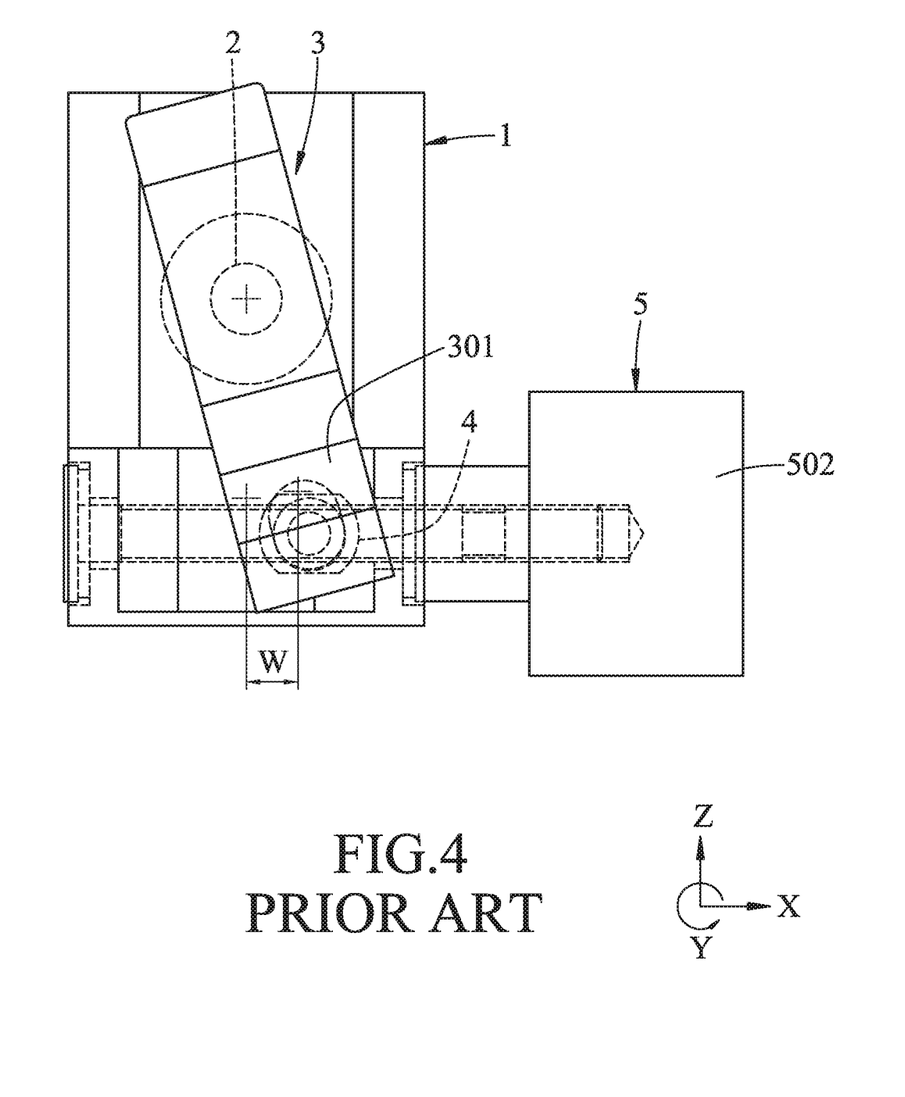
FIG. 4 is a view similar to FIG. 3, illustrating the deflection of a probe seat of the conventional deflecting device.

As shown in FIG. 4, when the adjustment knob 5 is turned, the threaded rod 501 drives the nut member 4 to move to the left or the right (in FIG. 4, it is moved to the right), and the probe seat 3 is turned with the nut member 4 to deflect leftward or rightward around the axis of the shaft 2. Thus, a probe (not shown) attached to the mounting plate 301 can be oriented to a desired angular position for testing a PCB board (not shown).

However, such a deflecting device suffers from the following shortcomings in use:

1. As shown in FIG. 1, a longitudinal dimension (L) of the probe seat 3 could be as long as 56 mm, so that when the probe seat 3 is deflected, the wires of probe are liable to get stuck by the probe seat 3.
2. As shown in FIG. 2, the threaded rod 501 of the adjustment knob 5 is exposed outside the base seat 1 on both sides of the probe seat 3, so that the threaded rod 501 is liable to be contaminated with dust, therefore, frequent maintenance is required. In addition, the lubricating oil on the threaded rod 501 would also be contaminated by dust.
3. As shown in FIGS. 3 and 4, the probe seat 3 is turnable around the axis of shaft 2, a distance (H) between the center of the mounting plate 301 of the probe seat 3 and the axis of shaft 2 could be up to 14 mm in an up-down direction (Z). Thus, when the probe seat 3 is slightly turned, a significant transverse displacement (W) will be caused to the mounting plate 301 as well as the probe attached. For example, in the case of a 15-degree deflection, the transverse displacement (W) could be as high as 3.62 mm, as a result, the probe is difficult to be accurately positioned to the testing position. For this reason, a triaxial adjustment mechanism (not shown) should be used to adjust the position of the whole deflecting device in the transverse direction.
4. The adjustment knob 5 is disposed at a lower position of the base seat 1, and the manual knob 502 extends beyond the bottom side of the base 1 in the up-down direction (Z). Thus, when the deflecting device is moved towards the PCB (not shown) for carrying out a test, the manual knob 502 could touch the components on the PCB to damage the same. Besides, the arrangement of the adjustment knob 5 is inconvenient to be operated.

SUMMARY

Therefore, the object of the disclosure is to provide a deflecting device for a probe that overcomes at least one of the above disadvantages.

According to the disclosure, a deflecting device includes a base member, an axle member, a probe connector assembly, a swing arm assembly, and an actuating assembly.

The base member includes a housing that defines a first groove and a second groove communicated with the first groove.

The axle member is disposed in the first groove, and has a front end that extends out of the housing in a front-rear direction.

The probe connector assembly includes a probe mounting seat that is connected to the front end of the axle member.

The swing arm assembly includes a swing arm that is disposed in the first groove. The swing arm has an upper end and a lower end that is lower than the upper end in a up-down direction. The upper end is formed with a guide slot. The lower end is fixedly connected to the axle member.

The actuating assembly includes a screw member that is turnably mounted to the base member and that extends in a left-right direction, and a slider member that has an engaging portion engaging with the second groove and being slidable in the left-right direction, and a tubular portion extending in the front-rear direction from the engaging portion and engaging with the guide slot. The tubular portion has a width in the up-down direction which is smaller than that of the guide slot. The engaging portion is formed with a threaded driven hole that extends in the left-right direction and that screws with the screw member, such that the swing arm is engaged with the slider member and that the screw member is operable to drive the probe mounting seat to deflect around an axis of the axle member.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 5:
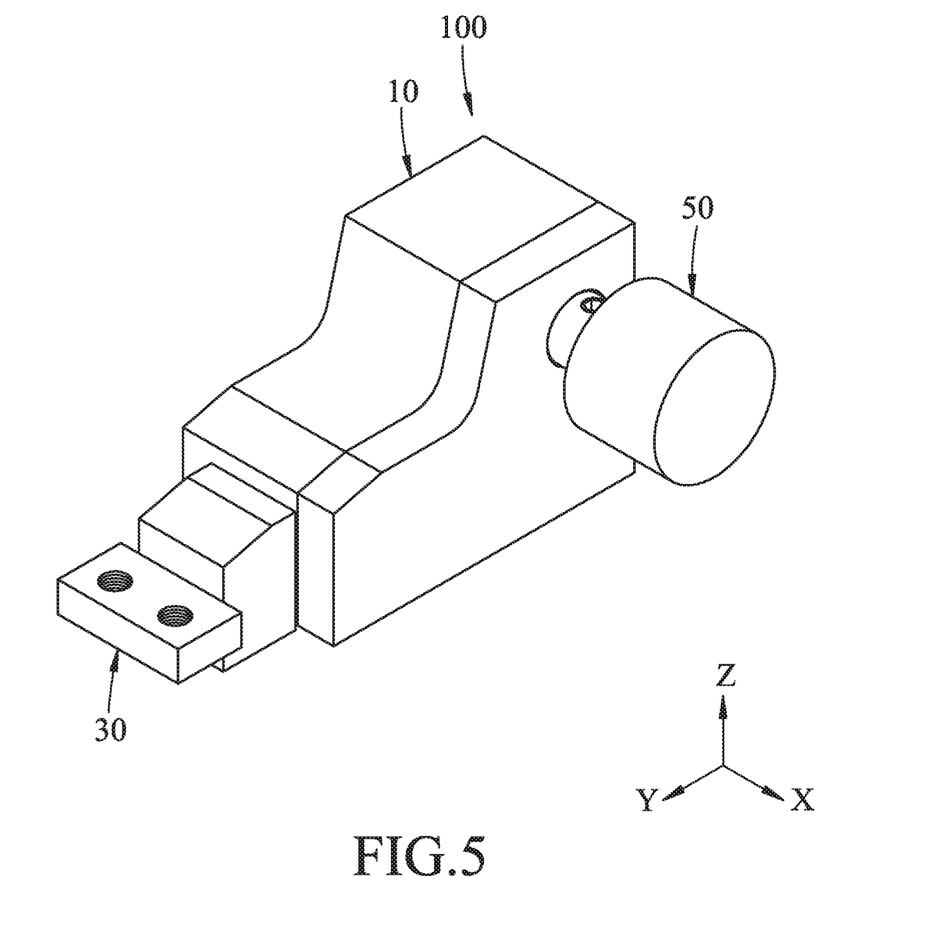
FIG. 5 is a perspective view of an embodiment of a deflecting device for a probe of the present disclosure.

Referring to FIG. 5, an embodiment of a deflecting device 100 for a probe according to the present disclosure is shown.

Figure 6:
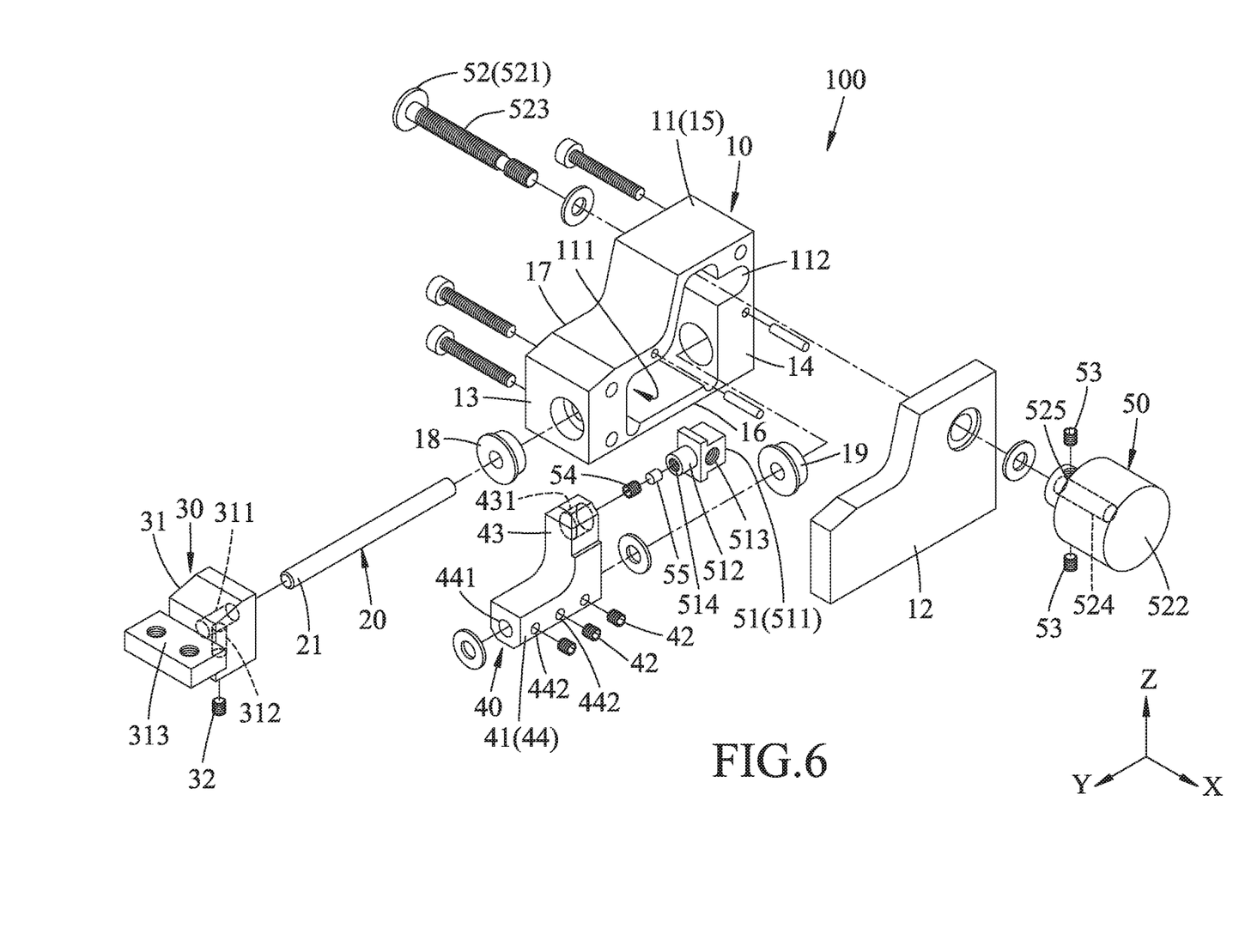
FIG. 6 is an exploded perspective view of the embodiment.
Figure 7:
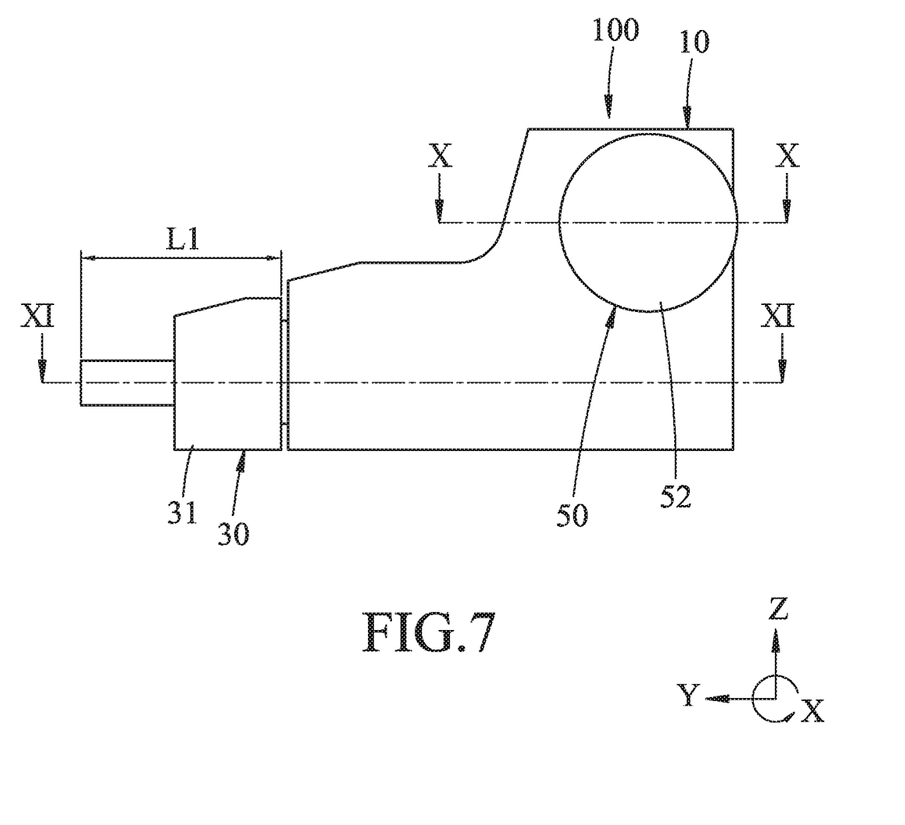
FIG. 7 is a right side view of the embodiment.
Figure 8:
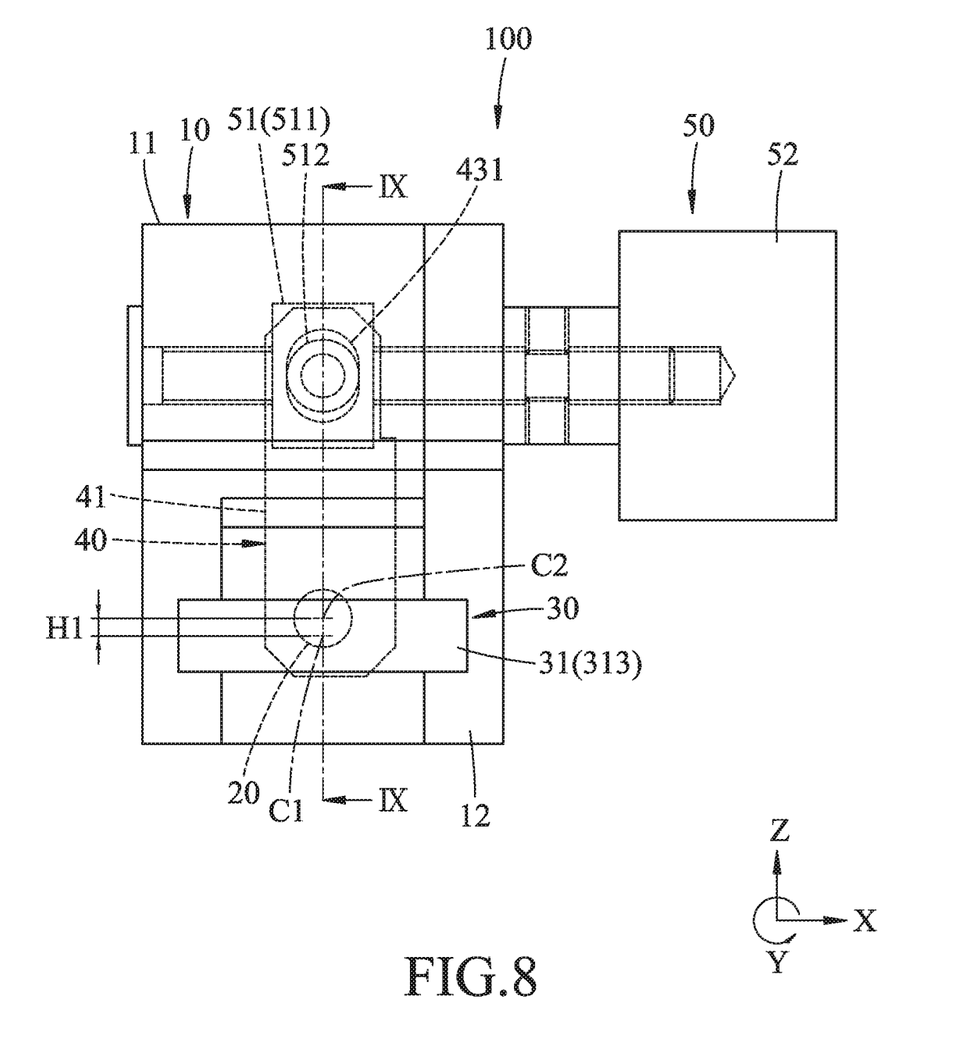
FIG. 8 is a front view of the embodiment.

As shown in FIGS. 6, 7, and 8. The embodiment of deflecting device 100 includes a base member 10, an axle member 20, a probe connector assembly 30, a swing arm assembly 40 and an actuating assembly 50.

Figure 9:
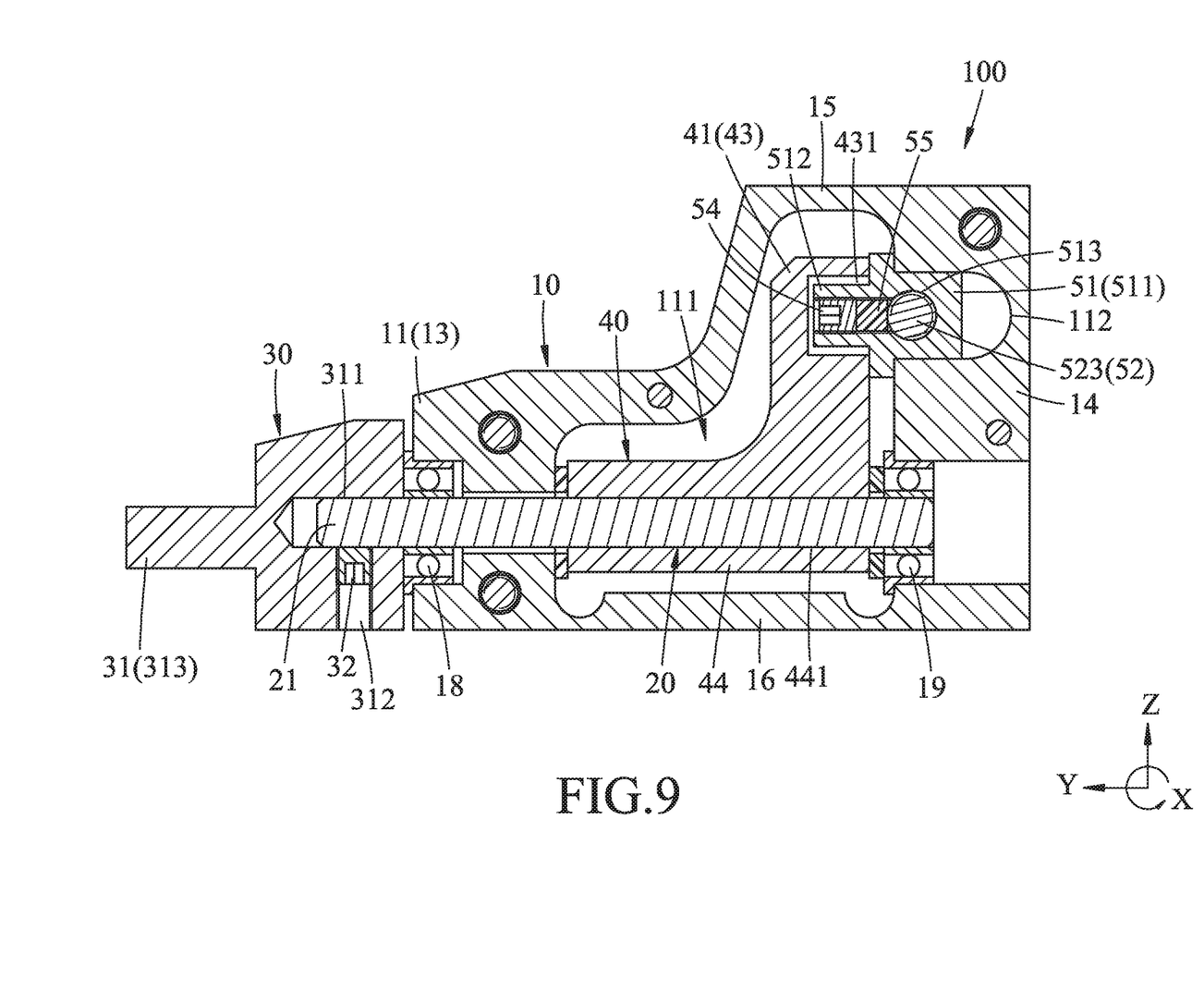
FIG. 9 is a cross-sectional view taken along line IX-IX in FIG. 8.
Figure 10:
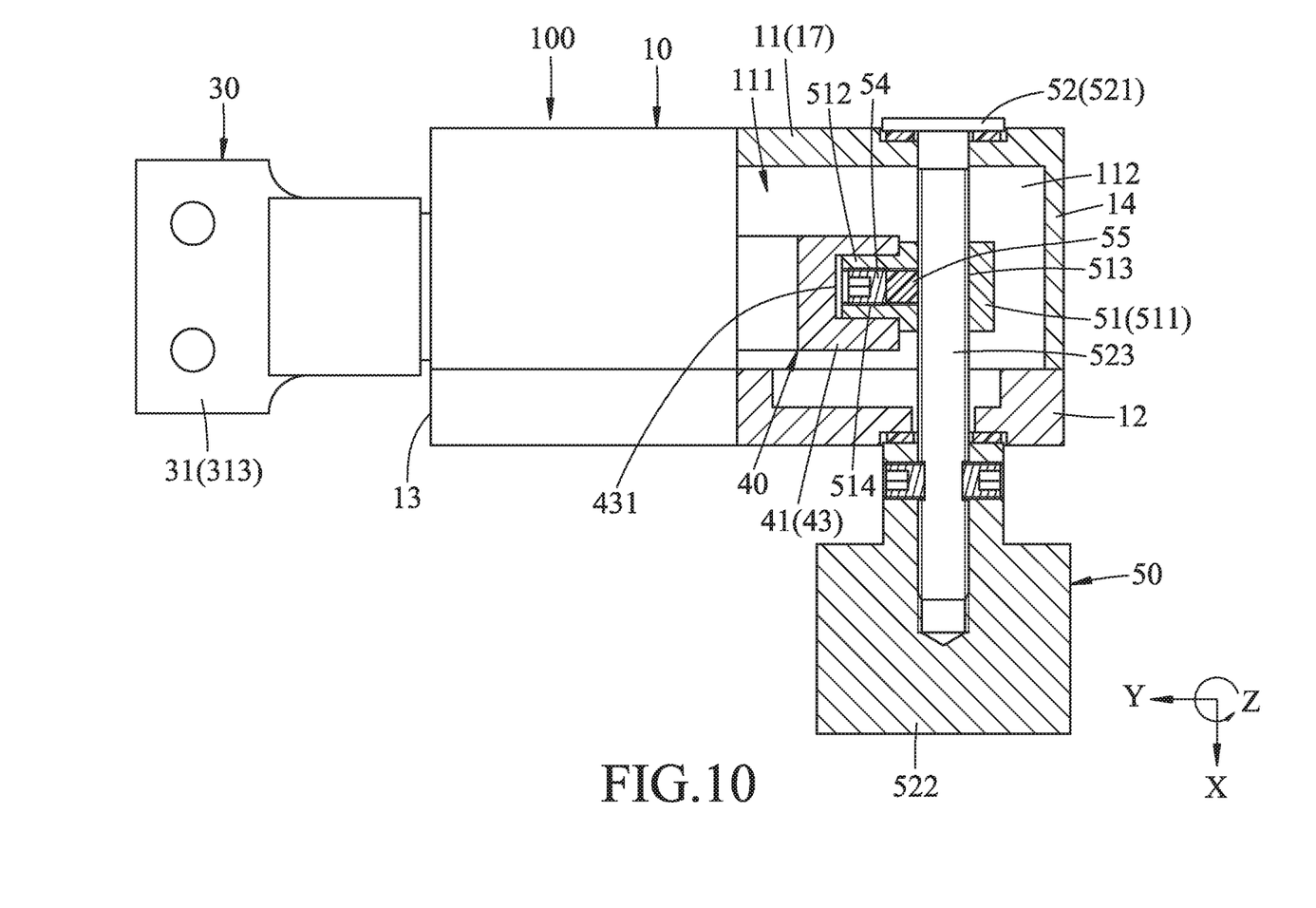
FIG. 10 is a cross-sectional view taken along line X-X in FIG. 7.

As shown in FIGS. 6, 9, and 10, the base member 10 includes a housing 11 and a side cover 12 detachably disposed on the housing 11.

The housing 11 is formed with a first groove 111 and a second groove 112 which is communicated with the first groove 11. In this embodiment, the housing 11 has a front wall 13, a rear wall 14 spaced apart from the front wall 13 in a front-rear direction (Y), top and bottom walls 15, 16 connected between the front and rear walls 13, 14 and spaced apart in an up-down direction (Z), and a side wall 17 connected between the front wall 13, the rear wall 14, the top wall 15 and the bottom wall 16 at one side of the housing 11. The housing 11 further includes a front bearing 18 disposed in the front wall 13 and a rear bearing 19 disposed in the rear wall 14 for supporting the axle member 20. In this embodiment, the first groove 111 is confined by the front wall 13, rear wall 14, top wall 15, bottom wall 16 and side wall 17 of the housing 11, and the second groove 112 is recessed on the rear wall 14 near the top wall 15 of the housing 11. The side cover 12 is opposite to the side wall 17 in a left-right direction (X) and is coupled detachably to the front and rear walls 13, 14, and the top and bottom walls 15, 16.

Figure 11:
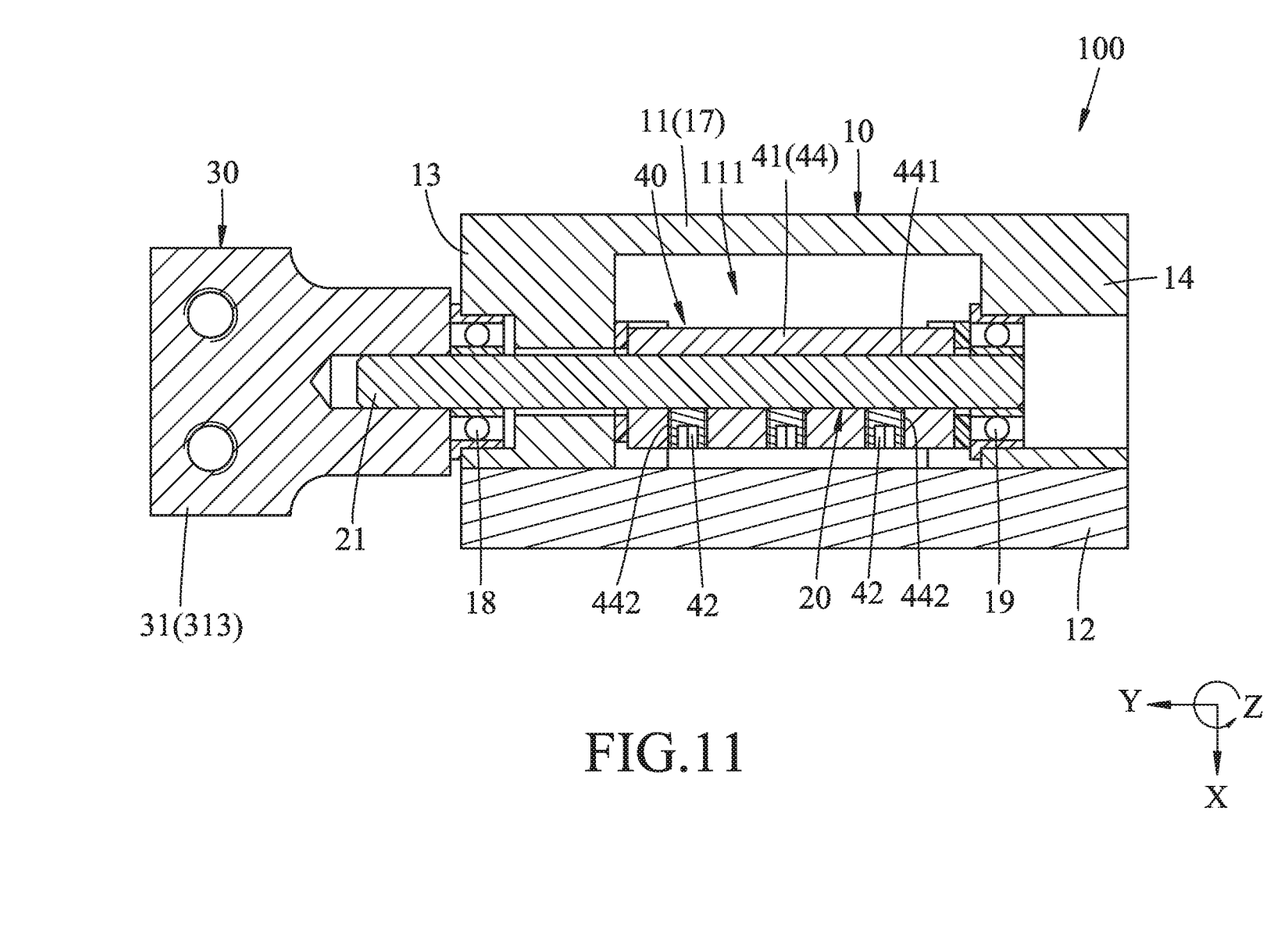
FIG. 11 is a cross-sectional view taken along line XI-XI in FIG. 7.

As shown in FIGS. 6, 9, and 11, the axle member 20 extends in the front-rear direction (Y), is turnably supported by the front and rear bearings 18, 19 and longitudinally extends through the first groove 111, with a front end 21 thereof extending out through the front wall 13.

As shown in FIGS. 6, 9, and 11, the probe connector assembly 30 includes a probe mounting seat 31 connected to the front end 21 of the axle member 20, and a first clamp stud 32.

The probe connector base 31 is formed with a first mounting bore 311 extending in the front-rear direction (Y), and a first tapped hole 312 being transverse to and communicating with the first mounting bore 311. The front end 21 of the axle member 20 is inserted into the first mounting bore 311. The probe mounting seat 31 has a mounting plate 313. A center (C1) (see FIG. 8) of the mounting plate 313 is adjacent to an axis (C2) (see FIG. 8) of the axle member 20.

The first clamp stud 32 is screwed into the first tapped hole 312 to clamp the front end 21 of the axle member 20. In this embodiment, the first clamp stud 32 may be glued before being screwed into the first tapped hole 312 so as to lock the first clamp stud 32 in position after engaged in the first tapped hole 312, but it is not limited to this.

As shown in FIG. 6, the swing arm assembly 40 includes a swing arm 41 disposed in the first groove 111, and a plurality of second clamp studs 42.

As shown in FIGS. 9, 10 and 11, the swing arm 41 is formed as a L-shaped piece, and has a top end 43 and a lower end 44 that is lower than the upper end 43 in the up-down direction (Z). The top end 43 is formed with an upright guide slot 431. The lower end 44 is formed with a second mounting bore 441 that extends in the front-rear direction (Y), and a number of second tapped holes 442 that are transverse to and communicated with the second mounting bore 441.

The axle member 20 passes through the second mounting bore 441, and the second clamp studs 42 are screwed to the second tapped holes 442 respectively to clamp the axle member 20. In this embodiment, each second clamp stud 42 is glued before being screwed into the respective second tapped hole 442 so as to lock the second clamp stud 42 in position after engaged in the respective tapped hole 442, but it is not limited to this.

As shown in FIGS. 6, 9, and 10, the actuating assembly 50 includes a slider member 51 received in the second groove 112, a screw member 52 turnably mounted to the base member 10 and extending in the left-right direction (X), a number of third clamp studs 53, a fourth clamp stud 54, and a clamp block 55.

The slider member 51 has an engaging portion 511 engaging with the second groove 112 and being slidable in the left-right direction (X), and a tubular portion 512 extending in the front-rear direction (Y) from the engaging portion 511 and engaging with the guide slot 431. The tubular portion 512 has a width in the up-down direction (Z) which is smaller than that of the guide slot 431. The engaging portion 511 is formed with a threaded driven hole 513 extending in the left-right direction (X). The slider member 51 is further formed with a fourth tapped hole 514 extending in the front-rear direction (Y) and communicating with the threaded driven hole 513. In this embodiment, the slider member 51 is made of copper matrix self-lubricious material.

The screw member 52 has an abutment end 521 located outside the side wall 17 and abutting against the side wall 17, a screw knob 522 located outside the side cover 12 and abutting against the side cover 12, and a screw shaft 523 extended through the side wall 17 and side cover 12 between the abutment end 521 and the screw knob 522.

The screw knob 522 is formed with a third mounting bore 524 extending in the left-right direction (X) and engaged with the screw shaft 523 of the screw member 52, and a plurality of third tapped holes 525 being transverse to and communicated with the third mounting bore 524. The screw shaft 523 is screwed with the threaded driven hole 513 of the slider member 51, and one end of the screw shaft engages into the third mounting bore 524.

The third clamp studs 53 are screwed to the third tapped hole 525 respectively to clamp the screw shaft 523. In this embodiment, each third clamp stud 53 is glued before being screwing into a respective third tapped hole 525 so as to lock the third clamp stud 53 in position after engaged in the respective third tapped hole 525, but it is not limited to this.

The clamp block 55 is disposed in the fourth tapped hole 514, and the fourth clamp stud 54 is screwed to the clamp tapped hole 514 to push the clamp block 55 against the screw shaft 523 of the screw member 52.

In this embodiment, the clamp block 55 is made of nylon. Through tightening the inner clamp stud 54, the clamp block 55 is forced to push against the screw shaft 523 of the screw member 52, so that the backlash between the screw shaft 523 and the threaded driven hole 513 of the engaging portion 511 can be eliminated. Thus, once the screw member 52 is turned, the slider member 51 is immediately driven to move along the second groove 112 in the left-right direction (X).

Figure 12:
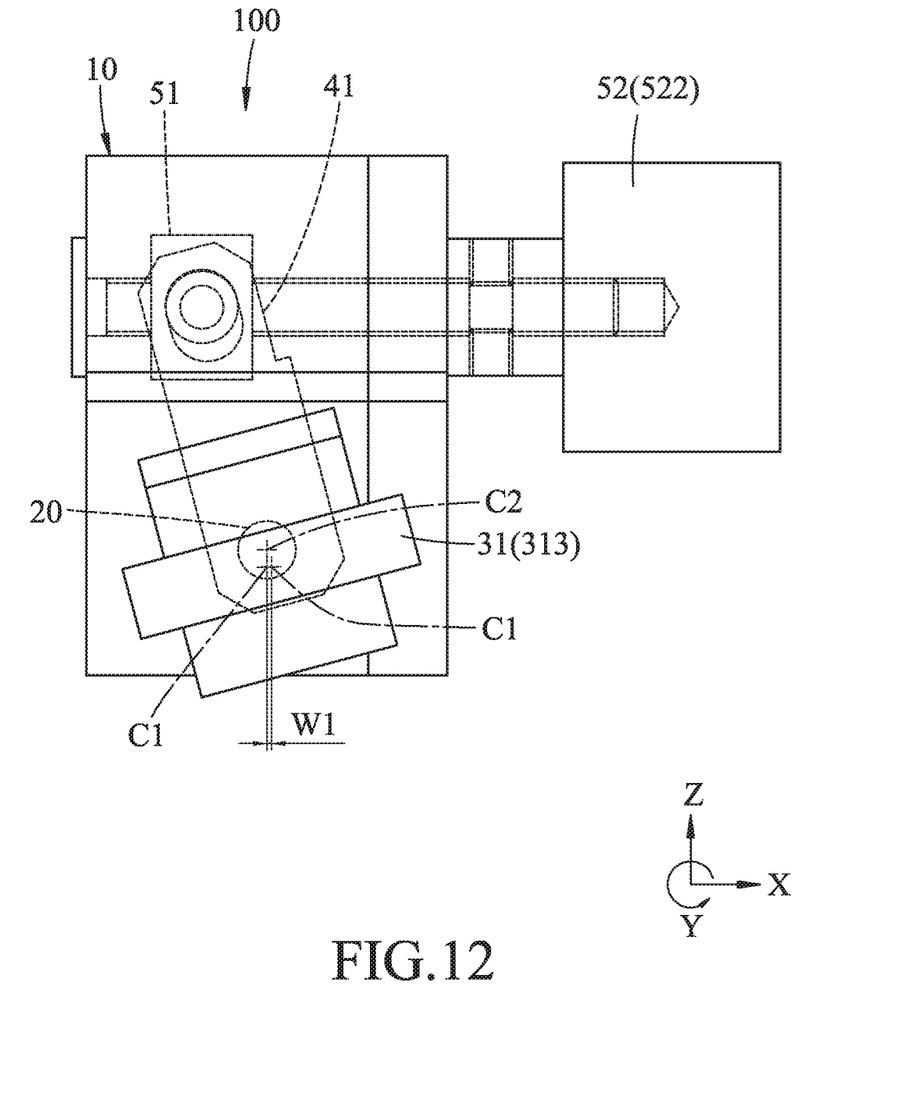
FIG. 12 is a view similar to FIG. 8, illustrating a probe mounting seat of the embodiment turned to the left.
Figure 13:
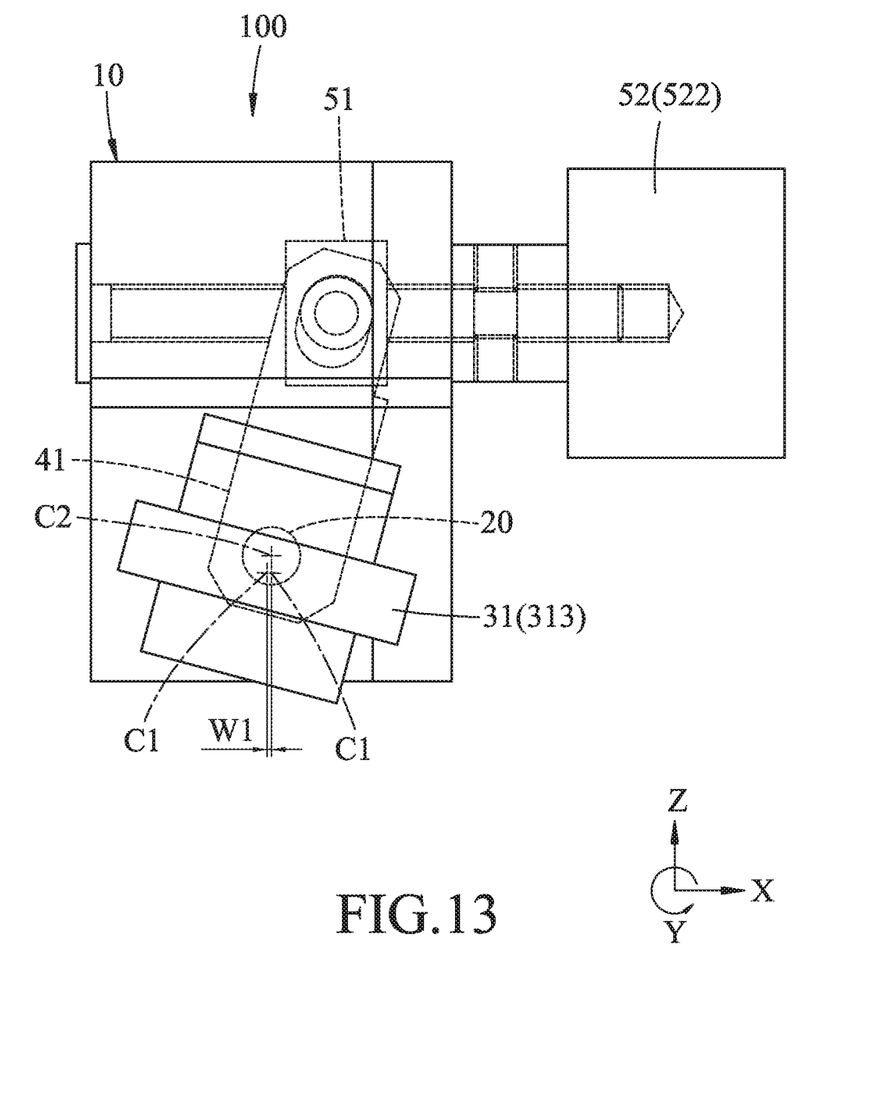
FIG. 13 is a view similar to FIG. 12, illustrating the probe mounting seat turned to the right.

As shown in FIG. 12 and FIG. 13, the screw member 52 is configured to drive the slider member 51 to deflect the swing arm 41 around the axis of axle member 20, and the probe connector base 31 is deflected along with the axle member 20.

Figure 14:
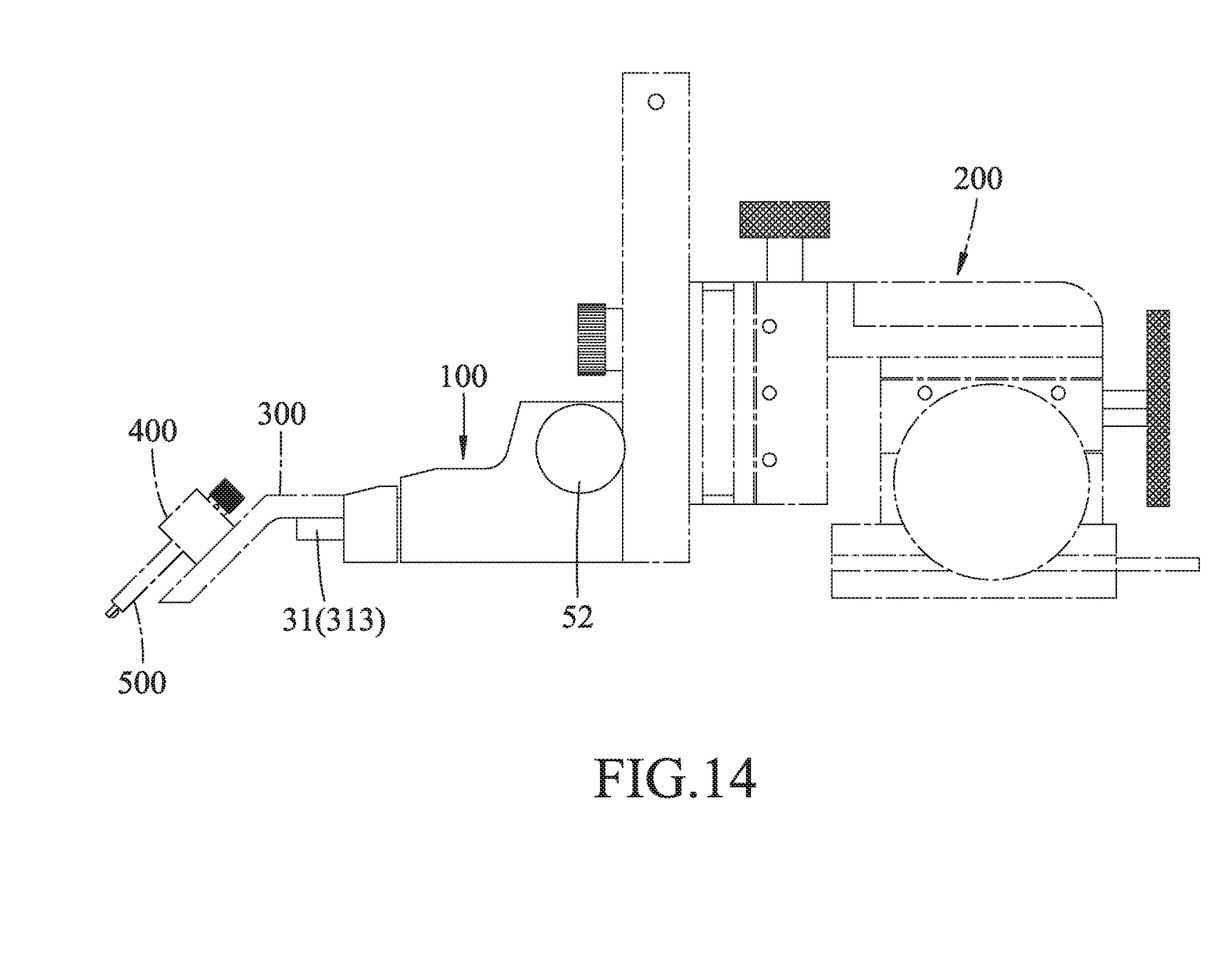
FIG. 14 is a schematic view showing the state in which the embodiment is assembled with a triaxial adjustment mechanism, with a probe attached to the probe mounting seat.

Thereby, as shown in FIGS. 12, 13, and 14, when carrying out the present disclosure, the deflecting device 100 can be incorporated with a triaxial-adjustment mechanism 200. An extension plate 300 for supporting a probe holder 400 is attached to the mounting plate 313, and a probe holder 400 with a probe 500 fixed thereon is located on the extension plate 300. Thus, when the user turns the screw knob 522, The slider member 51 is driven by the screw member 52 to move to the left or to the right, so that the slider member 51 drives the probe mounting seat 31 via the swing arm 41 and the axle member 20 to deflect around the axis of the axle member 20. Thus, the probe 500 mounted on the probe mounting seat 31 can perform testing to a PCB board (not shown) with varied angles.

Through the above description, the advantages of the present disclosure can be further summarized as follows:

1. As shown in FIG. 7, the probe mounting seat 31 to be deflected by the screw member 52 is located outside of the base member 10. Compared with the prior art, a longitudinal dimension (L1) (e.g. 22.5 mm) of the mounting seat 31 in the front-rear direction (Y) is much smaller than the longitudinal dimension (L) (56 mm, see FIG. 1) in the case of the abovementioned conventional probe seat 3, therefore, when the probe connector 31 is deflected, the swept area is relatively small, and the problem regarding the wires of the probe 500 (see FIG. 14) could be stuck by the probe mounting seat 31 is less likely to occur.

2. As shown in FIG. 10, the section of the screw shaft 523 of the screw member 52 screwed with the slider member 51 is completely covered by the housing 11 rather than exposed. Compared to the prior art, the screw shaft 523 is less likely to be contaminated with dust, and frequent maintenance is not required. Also, the lubricating oil on the screw shaft 523 is less likely to be contaminated by dust.

3. As shown in FIG. 8, the probe mounting seat 31 of the present disclosure is turned about the axis of axle member 20, the center (C1) of the mounting plate 313 of the probe mounting seat 31 as shown is close to the axis (C2) of the axle member 20. Compared with the prior art, a distance (H1) (e.g. 1.2 mm) between the center (C1) of the mounting plate 313 of the probe connector 31 and the axis (C2) of the axle member 20 in the up-down direction (Z) is much smaller than the distance (H) (14 mm, see FIG. 3) in the abovementioned prior art. As shown in FIGS. 12 and 13, It can be seen that, when the probe mounting seat 31 is deflected, only a relatively small transverse displacement (W1) occurs in the left-right direction (X). For example, for a deflection angle 15° the transverse displacement (W1) is only 0.31 mm. Therefore, the probe 500 (see FIG. 14) fixed to the mounting plate 313 is deflected a small angle of the same magnitude too, so that the probe 500 (see FIG. 14) can be accurately adjusted in accordance with the point test position without using a triaxial-adjustment mechanism 200 (see FIG. 14) to adjust the position of the whole deflecting device as a compensation.

4. The screw member 52 of the present disclosure is disposed near the top wall 15 of the housing 11. The screw knob 522 of the screw member 52 does not exceed the bottom side of the housing 11 in the up-down direction (Z). Compared with the prior art, when the deflecting device of the present disclosure is moved towards the PCB for carrying out a test to the PC board (not shown), the screw knob 522 does not easily touch the components on the PCB, thus effectively avoid damages to the components on the PCB, and ensure a convenient operation of the screw member 52.

5. The fourth clamp stud 54 is used to push the clamp block 55 against the screw shaft 523 of the screw member 52 to eliminate backlash between the screw shaft 523 and the threaded driven hole 513 of the slider member 51 caused by manufacturing clearances, to prevent idling between the screw member 52 and the slider member 51 while the screw member 52 is turned.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A deflecting device for a probe, comprising:
    a base member including a housing that defines a first groove and a second groove communicated with said first groove;
    an axle member disposed in said first groove, and having a front end that extends out of said housing in a front-rear direction;
    a probe connector assembly including a probe mounting seat that is connected to said front end of the axle member;
    a swing arm assembly including a swing arm that is disposed in said first groove, said swing arm having an upper end and a lower end that is lower an said upper end in a up-down direction, said upper end being formed with a guide slot, said lower end being fixedly connected to said axle member; and
    an actuating assembly including a screw member that is turnably mounted to said base member and that extends in a left-right direction, and a slider member that has an engaging portion engaging with said second groove and being slidable in the left-right direction, and a tubular portion extending in the front-rear direction from said engaging portion and engaging with said guide slot, said tubular portion having a width in the up-down direction which is smaller than that of said guide slot, said engaging portion being formed with a threaded driven hole that extends in the left-right direction and that screws with said screw member, such that said swing arm is engaged with said slider member and that said screw member operable to drive said probe mounting seat to deflect around an axis of said axle member.

2. The deflecting device as claimed in claim 1, wherein the probe connector assembly further includes a first clamp stud, said probe mounting seat being formed with a first mounting bore that extends in the front-rear direction and a first tapped hole that is transverse to and communicated with said first mounting bore, the front end of said axle member being inserted in said first mounting bore, with said first clamp stud screwed into said first tapped hole to clamp said front end.

3. The deflecting device as claimed in claim 2, wherein said probe mounting seat includes a mounting plate lying adjacent to the axis of said axle member.

4. The deflecting device as claimed in claim 1, wherein the swing arm assembly further includes a plurality of second clamp studs, said lower end of said swing arm being formed with a second mounting bore that extends in the front-rear direction and a plurality of second tapped holes that are transverse to and communicated with said second mounting bore, said axle member being mounted into said second mounting bore, with said second clamp studs screwed into said second tapped holes respectively to clamp said axle member.

5. The deflecting device as claimed in claim 1, wherein said housing includes a front wall, a rear wall spaced apart from said front wall in the front-rear direction, and front and rear bearings disposed respectively on said front wall and said rear wall for supporting said axle member, said second groove being formed in said rear wall.

6. The deflecting device as claimed in claim 5, wherein said housing further includes top and bottom walls connected between said front and rear wails, and a side wall connected between said front and rear walls and said top and bottom walls at one side, said base member further including a side cover that is opposite to said side wall in the left-right direction and that is coupled detachably to said front and rear walls and said top and bottom walls, said screw member including an abutment end that is located outside said side wall and that abuts said side wall, a screw knob that is disposed outside the side cover and that abuts the side cover, and a screw shaft that is connected between said abutment end and said screw knob, said screw shaft being screwed into said threaded driven hole of said slider member.

7. The deflecting device as claimed in claim 6, wherein the actuating assembly further includes a third clamp stud, the screw knob being formed with a third mounting bore that extends the left-right direction and a plurality of third tapped holes that are transverse to and communicated with said third mounting bore, the screw shaft of said screw member being received in said third mounting bore, with said third clamp studs screwed with said third tapped holes respectively to clamp said screw shaft.

8. The deflecting device as claimed in claim 1, wherein said actuating assembly further includes a fourth clamp stud and a clamp block, said tubular portion of the slider member being further formed with a fourth tapped hole that extends in the front-rear direction and that communicates with said threaded driven hole, with said fourth clamp stud screwed into said fourth tapped hole to push against said screw member.

9. The deflecting device as claimed in claim 1, wherein said clamp block is made of nylon.

* * * * *